US011769652B2

(12) United States Patent
Chen et al.

(10) Patent No.: US 11,769,652 B2
(45) Date of Patent: Sep. 26, 2023

(54) DEVICES AND METHODS FOR CONTROLLING WAFER UNIFORMITY IN PLASMA-BASED PROCESS

(71) Applicant: Taiwan Semiconductor Manufacturing Co., Ltd., Hsinchu (TW)

(72) Inventors: Jr-Sheng Chen, Hsinchu (TW); An-Chi Li, Hsin-Chu (TW); Shih-Che Huang, Zhubei (TW); Chih-Hsien Hsu, Hsinchu (TW); Zhi-Hao Huang, Hsin-Chu (TW); Ming Chih Wang, Hsin-Chu (TW); Yu-Pei Chiang, Hsinchu (TW); Chun Yan Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/525,330

(22) Filed: Jul. 29, 2019

(65) Prior Publication Data
US 2020/0043705 A1 Feb. 6, 2020

Related U.S. Application Data

(60) Provisional application No. 62/712,662, filed on Jul. 31, 2018.

(51) Int. Cl.
*H01J 37/32* (2006.01)
*H01L 21/67* (2006.01)
*G06F 30/00* (2020.01)

(52) U.S. Cl.
CPC ........ *H01J 37/32449* (2013.01); *G06F 30/00* (2020.01); *H01J 37/3211* (2013.01); *H01J 2237/3341* (2013.01); *H01J 2237/3343* (2013.01); *H01L 21/67069* (2013.01)

(58) Field of Classification Search
None
See application file for complete search history.

(56) References Cited

U.S. PATENT DOCUMENTS

| 4,675,072 A | * | 6/1987 | Bennett | G01N 21/6402 156/345.25 |
| 4,718,976 A | * | 1/1988 | Fujimura | C23C 16/452 156/345.33 |
| 5,052,339 A | * | 10/1991 | Vakerlis | C23C 16/4558 118/723 E |
| 5,746,875 A | * | 5/1998 | Maydan | C23C 16/45574 118/723 E |

(Continued)

*Primary Examiner* — Keath T Chen
(74) *Attorney, Agent, or Firm* — Duane Morris LLP

(57) ABSTRACT

Devices and methods for controlling wafer uniformity in plasma-based process is disclosed. In one example, a device for plasma-based processes is disclosed. The device includes: a housing defining a process chamber and a gas distribution plate (GDP) arranged in the process chamber. The housing comprises: a gas inlet configured to receive a process gas, and a gas outlet configured to expel processed gas. The GDP is configured to distribute the process gas within the process chamber. The GDP has a plurality of holes evenly distributed thereon. The GDP comprises a first zone and a second zone. The first zone is closer to the gas outlet than the second zone. At least one hole in the first zone is closed.

18 Claims, 11 Drawing Sheets

(56) References Cited

U.S. PATENT DOCUMENTS

| | | | | |
|---|---|---|---|---|
| 6,132,552 A | * | 10/2000 | Donohoe | C23C 16/4405 |
| | | | | 118/723 I |
| 6,217,718 B1 | * | 4/2001 | Holmann | C23C 14/358 |
| | | | | 204/192.12 |
| 6,263,829 B1 | * | 7/2001 | Schneider | C23C 16/455 |
| | | | | 118/723 E |
| 6,835,277 B2 | * | 12/2004 | Park | H01J 37/32357 |
| | | | | 156/345.33 |
| 2003/0037880 A1 | * | 2/2003 | Carducci | H01L 21/76897 |
| | | | | 156/345.43 |
| 2003/0051994 A1 | * | 3/2003 | Gopalraja | C23C 14/0057 |
| | | | | 204/192.12 |
| 2004/0060514 A1 | * | 4/2004 | Janakiraman | C23C 16/455 |
| | | | | 118/715 |
| 2004/0261712 A1 | * | 12/2004 | Hayashi | H01L 21/67069 |
| | | | | 118/723 E |
| 2005/0145170 A1 | * | 7/2005 | Matsubara | C23C 16/4405 |
| | | | | 118/715 |
| 2011/0104902 A1 | * | 5/2011 | Yamazawa | C23C 16/455 |
| | | | | 438/710 |
| 2012/0295014 A1 | * | 11/2012 | Guyaux | C23C 14/24 |
| | | | | 427/9 |
| 2013/0115781 A1 | * | 5/2013 | Matsumoto | H01J 37/32192 |
| | | | | 438/726 |

\* cited by examiner

DEVICES AND METHODS FOR CONTROLLING WAFER UNIFORMITY IN PLASMA-BASED PROCESS

CROSS-REFERENCE TO RELATED APPLICATION

The present application claims priority to U.S. Provisional Patent Application No. 62/712,662, filed on Jul. 31, 2018, which is incorporated by reference herein in its entirety.

BACKGROUND

Plasma based processing techniques have gained widespread use in fabrication of devices for various applications, such as semiconductor integrated devices, microelectronic devices, and microelectromechanical device. A critical goal when patterning techniques such as photolithography, deposition, and etching are used to form various features on a wafer in a semiconductor process chamber is to have uniform critical dimensions (CD) of the patterned features within the wafer.

A key factor for wafer uniformity during a plasma based process, e.g. etching, deposition, or polishing, is the plasma distribution on the wafer surface. A wafer process chamber includes a gas distribution plate (GDP), a gas inlet, a gas outlet, and a radio frequency (RF) inlet. Each of these components can impact the plasma distribution in the wafer process chamber, thus impacting the CD uniformity of the wafer as well. An existing design of GDP is isotropic, i.e. treating all orientations on the plate surface to be the same, which cannot satisfy a uniformity requirement, especially in through-silicon via (TSV) and deep silicon etching processes which have a high standard of etching uniformity.

Therefore, existing devices and methods for controlling wafer uniformity in plasma-based process are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
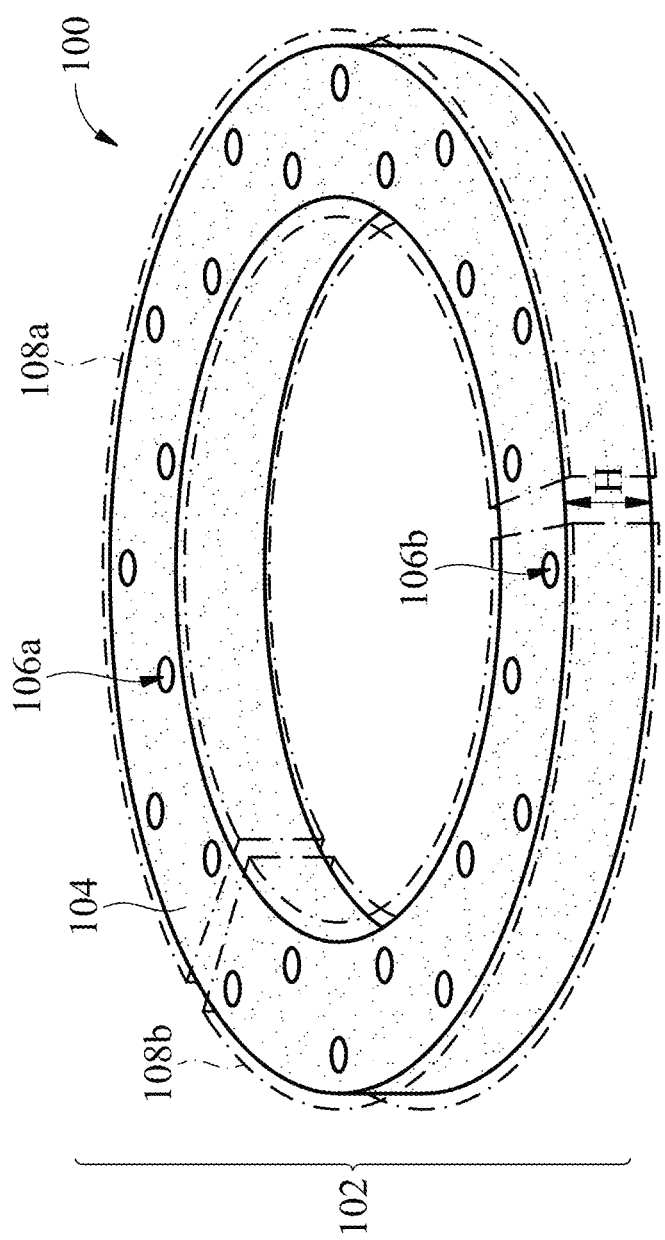
FIG. 1 illustrates a perspective view of an exemplary gas distribution plate (GDP), in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Wafer uniformity control is a tough task for all stages in plasma based processing. For example, critical dimension (CD) performance in deep silicon etching process is hard to control but is critical to final wafer testing, e.g. wafer acceptance test (WAT) or circuit probe (Cp), which can easily suffer a loop edge or a low yield.

One approach for achieving uniform plasma-based etching is to use a gas distribution plate (GDP). The GDP is arranged in a process chamber and comprises an array of holes through which process gas enters the process chamber. The holes have a same size and are evenly spaced in a distribution pattern, such that the process gas is distributed in the process chamber according to the distribution pattern. By distributing the process gas, the GDP improves plasma uniformity and hence etching uniformity. However, due to the same size and even spacing of the holes, the GDP does not compensate for non-uniformities in the plasma and etching caused by a layout of the process chamber. The layout may be defined by, for example, an arrangement of gas inlets, gas outlets, radio frequency (RF) inlet electrode, or a combination of the foregoing. As such, existing design of GDP is not enough for controlling etching uniformity. For example, etching uniformity is highly desired for notching window of a high-density deep-depth and low-pitch via, e.g. used to gain scan-through efficiency of optical sensing in an under-display fingerprint recognition component of a portable device. In one example, while silicon etching uniformity needs to be less than 10% for a through-silicon via (TSV) with a depth/width aspect ratio larger than 15 and a pitch less than 8 micrometers, a process tool with an existing design of GDP can merely achieve an etching uniformity of 23.3%.

The present application is directed towards process devices and methods for achieving a high uniformity in plasma-based etching with a newly designed GDP. In some embodiments, the GDP comprises a body with a plurality of holes and a plurality of zones into which the holes are grouped. The holes extend through the body, from a lower or bottom surface of the body to an upper or top surface of the body. In some embodiments, the holes on the GDP are not all the same, but are designed differently in different zones of the GDP based on a layout of the gas inlet, the gas outlet, and/or the RF inlet of the process chamber where the GDP is arranged.

In one embodiment, the zones are laterally arranged around a periphery of the body and comprise a first zone and a second zone. The first zone is closer to the gas outlet than the second zone; and at least one hole in the first zone is closed to reduce the gas flow and etching rate at the gas outlet side of the wafer and increase the gas flow and etching rate at the opposite side of the gas outlet of the wafer. This compensates for the wafer non-uniformity induced by the layout and position of the gas outlet in the process chamber.

In another embodiment, the zones are laterally arranged around a periphery of the body and comprise a first zone and a second zone located on different sides of the gas inlet. The first zone is closer to the gas outlet than the second zone; and holes in the first zone are refined to have an average area larger than that of holes in the second zone. This modification can reduce the gas pressure and etching rate of the wafer portion under the first zone and increase the gas pressure and etching rate the wafer portion under the second zone. This compensates for the wafer non-uniformity induced by the layouts and positions of both the gas inlet and the gas outlet in the process chamber.

The present disclosure is applicable to wafer uniformity control during any wafer processing using a GDP. The disclosed multi-zone GDP can improve etching uniformity to meet uniformity standards during bulk manufacture of TSV and deep silicon etching processes.

FIG. 1 illustrates a perspective view 100 of an exemplary gas distribution plate (GDP) 102, in accordance with some embodiments of the present disclosure. As shown in FIG. 1, the GDP 102 comprises a body 104 within which a plurality of holes 106a, 106b is arranged. In some embodiments, the body 104 extends laterally from an inner sidewall to an outer sidewall that laterally surrounds the inner sidewall. For example, the body 104 may be annular or ring-shaped. In other embodiments, an interior of the body 104 is continuous. For example, the body 104 may be cylindrical, square, or rectangular. Further, in some embodiments, the body 104 has a uniform height H, and/or is a ceramic, a metal, or a dielectric. The holes 106a, 106b extend through the body 104, from a lower or bottom surface of the body 104 to an upper or top surface of the body 104, and comprise respective cross-sectional profiles. In some embodiments, the holes 106a, 106b are uniformly spaced, and/or have a cylindrical shape or a rectangular cuboid shape. The holes 106a, 106b may be grouped into a plurality of zones 108a, 108b, based on at least one of positions of a gas inlet, a gas outlet and an RF inlet of the process chamber where the GDP 102 is located. In one embodiment, holes in different groups may have different opening statuses, closed or open. In another embodiment, holes in different groups may have different diameters or different areas.

As shown in FIG. 1, the zones 108a, 108b are laterally arranged along a periphery of the body 104. The zones 108a, 108b each comprise at least one of the holes 106a, 106b. In some embodiments, one or more of the zones 108a, 108b each comprise a plurality of the holes 106a, 106b. Holes in different zones may have different opening statuses, different diameters or different areas. In some embodiments, the GDP 102 has one or more additional zones. In some embodiments, the zones 108a, 108b are continuous or discontinuous. While the GDP 102 of FIG. 1 is illustrated with two zones 108a, 108b, and the zones 108a, 108b were illustrated as continuous, it is to be appreciated that additional zones and/or discontinuous zones are amenable. For example, the GDP 102 may comprise two continuous zones and one discontinuous zone. The GDP 102 may be employed with any plasma-based process in which uniform plasma is desired, e.g. plasma-based etching, plasma activation, etc.

Boundaries of the zones 108a, 108b and areas of holes in the zones may be designed based on at least one of positions of the gas inlet, the gas outlet and the RF inlet to compensate for non-uniform plasma in the process chamber. For example, an area of a hole in zone 108a may be larger than an area of a hole in zone 108b when the zone 108a is closer to the gas outlet than the zone 108b. This increases gas flowing velocity through the zone 108a, and hence compensates for historically low plasma intensity under the zone 108a relative to the zone 108b due to the position of the gas outlet.

Figure 2:
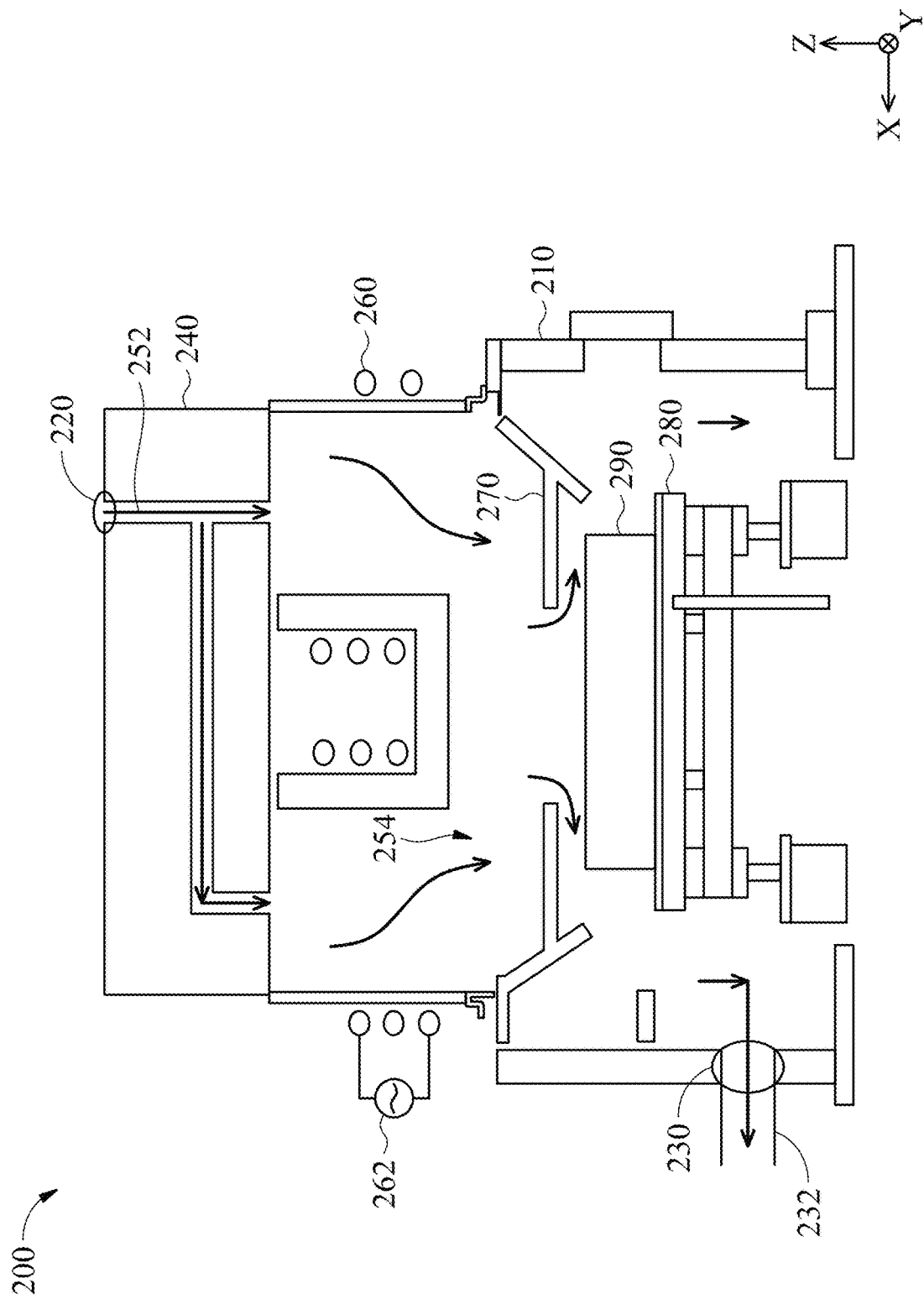
FIG. 2 illustrates a cross-sectional view of an exemplary plasma-based process tool with a GDP, in accordance with some embodiments of the present disclosure.

FIG. 2 illustrates a cross-sectional view of an exemplary plasma-based process tool 200 with a GDP 240, in accordance with some embodiments of the present disclosure. The process tool 200 may be configured to perform plasma-based etching, such as, for example, deep reactive ion etching (DRIE) or plasma etching. In some embodiments, the process tool 200 is configured to perform a Bosch process. As shown in FIG. 2, the processing tool 200 includes a housing 210 defining a process chamber, and a GDP 240 arranged in the process chamber 210. The housing 210 comprises a gas inlet 220 configured to receive a process gas 252, and a gas outlet 230 configured to expel processed gas. The GDP 240 is configured to distribute the process gas 252 within the process chamber 210.

In one embodiment, the GDP 240 has a plurality of holes evenly distributed thereon. The term "even" or "evenly" herein may refer to a uniform distribution of the holes with a constant density in a given area. After the GDP 240 receives the process gas 252 from the gas inlet 220, the process gas 252 enters the process chamber 210 through the holes on the GDP 240. The process gas 252 may include, for example, sulfur hexafluoride ($SF_6$) and/or octofluorocyclobutane ($C_4F_8$). As such, the GDP 240 distributes the process gas 252 received from the gas inlet 220 into the process chamber 210 through holes of the GDP 240.

The GDP 240 is located on top of an upper region of the process chamber 210 that is on top of a lower region of the process chamber 210 along the Z direction. The lower region of the process chamber 210 accommodates a wafer support 280 and is connected to a pumping line 232 through a gas outlet 230 of the housing. The wafer support 280 is configured to support a wafer 290 and, in some embodiments, is or otherwise comprises an electrode. The wafer 290 may be, for example, a 350 millimeter or 450 millimeter semiconductor wafer. The electrode may be, for example, electrically coupled to an RF source configured to promote the migration of particles from overlying plasma 254 towards the wafer support 280. In one embodiment, the pumping line 232 is connected to an exhaust pump (not shown in FIG. 2) configured to remove gases 250, 254 from the process chamber 210 and/or to otherwise control a pressure of the process chamber 310 relative to an ambient environment of the process tool 200.

As shown in FIG. 2, the process chamber 210 further comprises a spiral inductor 260 laterally spirals around the upper region of the process chamber and is electrically coupled to an RF source 262. The spiral inductor 260 is configured to receive RF energy from the RF source 262 through an RF inlet (not shown in FIG. 2) and excite the process gases 252 using the RF energy, thereby producing the plasma 254 with a high density in the upper region of the process chamber 210. A gas baffle 270 having an annular shape is placed above the wafer 290 to adjust the plasma distribution on the wafer 290. In operation, the plasma 254 goes through the gas baffle 270 and interfaces with the wafer 290 on the wafer support 280 to perform plasma-based etching. For example, the plasma 254 may chemically react with the wafer 290 to remove material from the wafer 290. As another example, chemical reaction of the wafer 290 with the plasma 254 and bombardment of the wafer 290 with particles of the plasma 254 may be employed to remove material from the wafer 290.

The process gas flowing velocity and plasma distribution on the wafer 290 can be controlled by the GDP 240 through a design of the holes on the GDP 240, based on position(s) of the gas inlet 220, the gas outlet 230, and/or the RF inlet of the spiral inductor 260. In this example, the gas outlet 230 is located on the left side, i.e. to the X direction, of the GDP 240, while the gas inlet 220 is located towards the right side, i.e. towards the −X direction, of the GDP 240. According to various embodiments, the gas inlet 220 and/or the gas outlet 230 may be located at other locations relative to the GDP 240. The RF inlet of the spiral inductor 260 is not shown in the cross-sectional view of the process tool 200 in FIG. 2. Since the gas outlet 230 and the pumping line 232 are coupled to each other, a position of the gas outlet 230 corresponds to a position of the pumping line 232. In the following description, a position of a gas outlet will be used to refer to both positions of the gas outlet and the connected pumping line.

Figure 3:
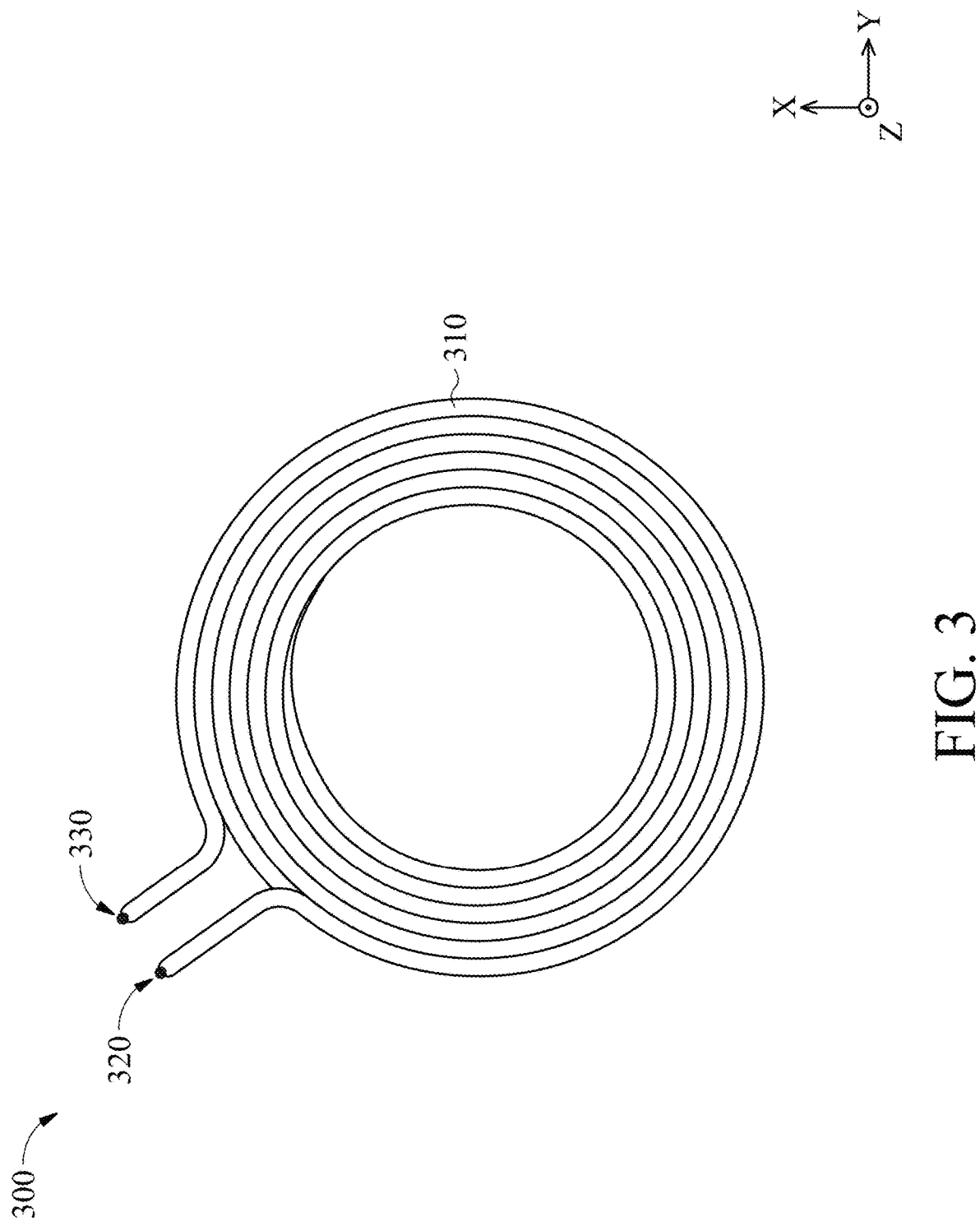
FIG. 3 illustrates an exemplary spiral inductor used in a plasma-based process tool, in accordance with some embodiments of the present disclosure.

FIG. 3 illustrates a top view 300 of an exemplary spiral inductor 310 used in a plasma-based process tool, in accordance with some embodiments of the present disclosure. As shown in FIG. 3, the spiral inductor 310 has a powered end 320 and a grounded end 330. The powered end 320 is coupled to an RF source and serves as an RF inlet to receive RF energy from the RF source. Compared to other portions of the spiral inductor 310, the RF inlet 320 is a portion that has a higher voltage and a higher ionization energy, which induces a stronger magnetic field and higher plasma density at the RF inlet 320. As such, a design of a GDP above the spiral inductor 310 may take into consideration of the position of the RF inlet 320. In this embodiment, the RF inlet 320 is located at the upper left side, i.e. to a direction between X and −Y, of the spiral inductor 310. The RF inlet 320 may be located at another direction of the spiral inductor 310 according to other embodiments.

Figure 4:
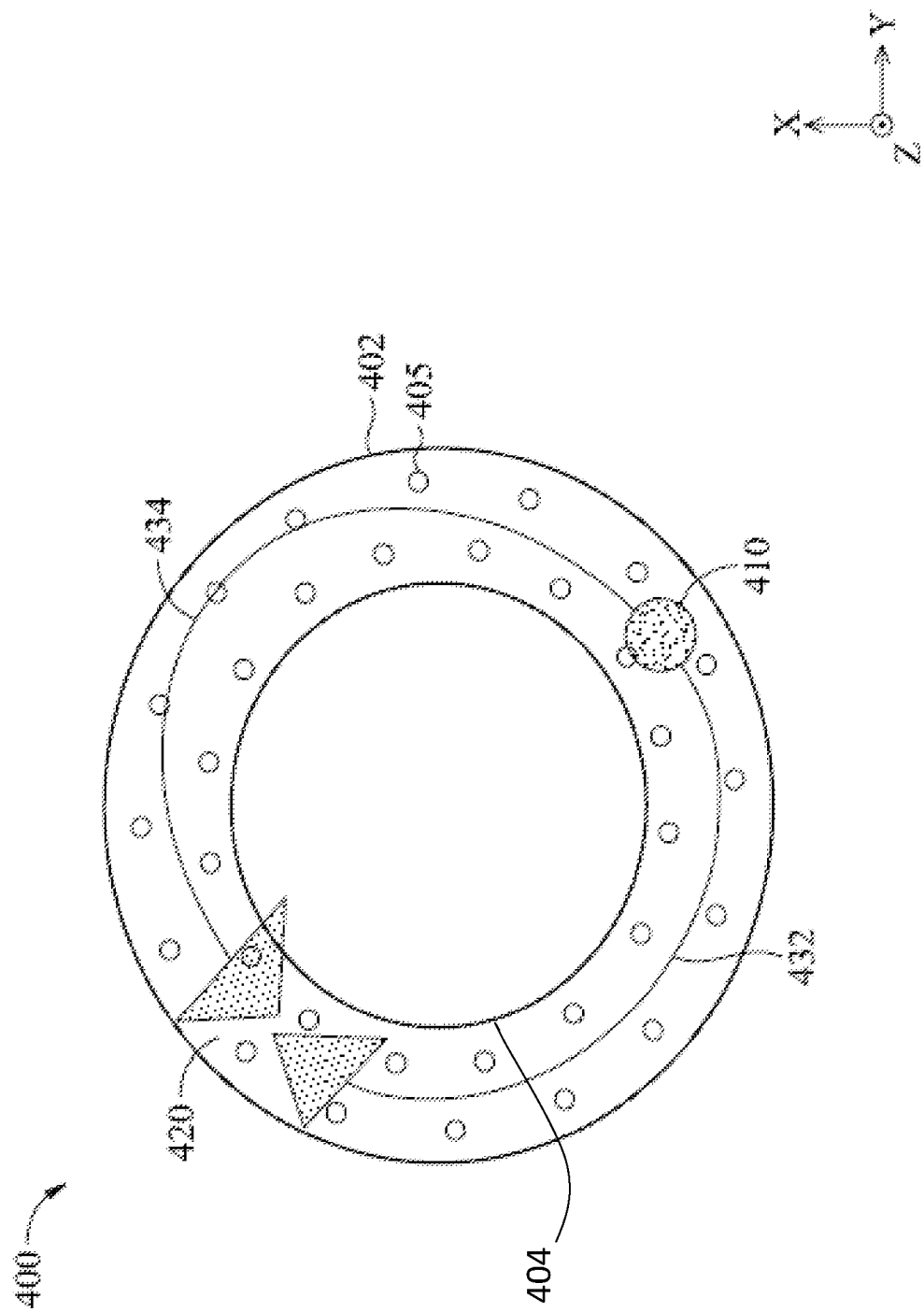
FIG. 4 illustrates a top view of an exemplary GDP with a marked gas inlet position, in accordance with some embodiments of the present disclosure.

FIG. 4 illustrates a top view of an exemplary GDP 400 with a marked gas inlet position, in accordance with some embodiments of the present disclosure. In one embodiment, the GDP 400 may be implemented as the GDP 240 in FIG. 2. As shown in FIG. 4, the GDP 400 in this example has an annular shape bordered by an outer circle 402 and an inner circle 404. The GDP 400 has a plurality of holes 405 evenly distributed thereon. As discussed before, a gas inlet is located above, i.e. to the Z direction of, the GDP 400 to receive process gas. FIG. 4 shows a projection area 410 of the gas inlet onto the GDP 400. The projection area 410 is a GDP portion having a shortest distance to the gas inlet and serves as a process gas source for the GDP 400, and is referred to as the gas inlet area 410. That is, the process gas received by the gas inlet first arrives at the gas inlet area 410 of the GDP 400, and then goes into the process chamber through the holes 405.

As shown in FIG. 4, the process gas may move along two paths 432, 434 into the process chamber. The path 432 extends from the gas inlet area 410 to the left side (along the −Y direction) and then to the upper side (along the X direction) of the gas inlet area 410. The path 434 extends from the gas inlet area 410 to the right side (along the Y direction) and then to the upper side (along the X direction) of the gas inlet area 410. In the example of FIG. 4, a first wafer portion under the gas inlet area 410 would interface with a higher density of process gas, e.g. $C_4F_8$, than the gas density at a second wafer portion under the area 420 which is farthest away from the gas inlet area 410 on the GDP 400, which would decrease the etching rate at the first wafer portion and increase the etching rate at the second wafer portion.

Figure 5:
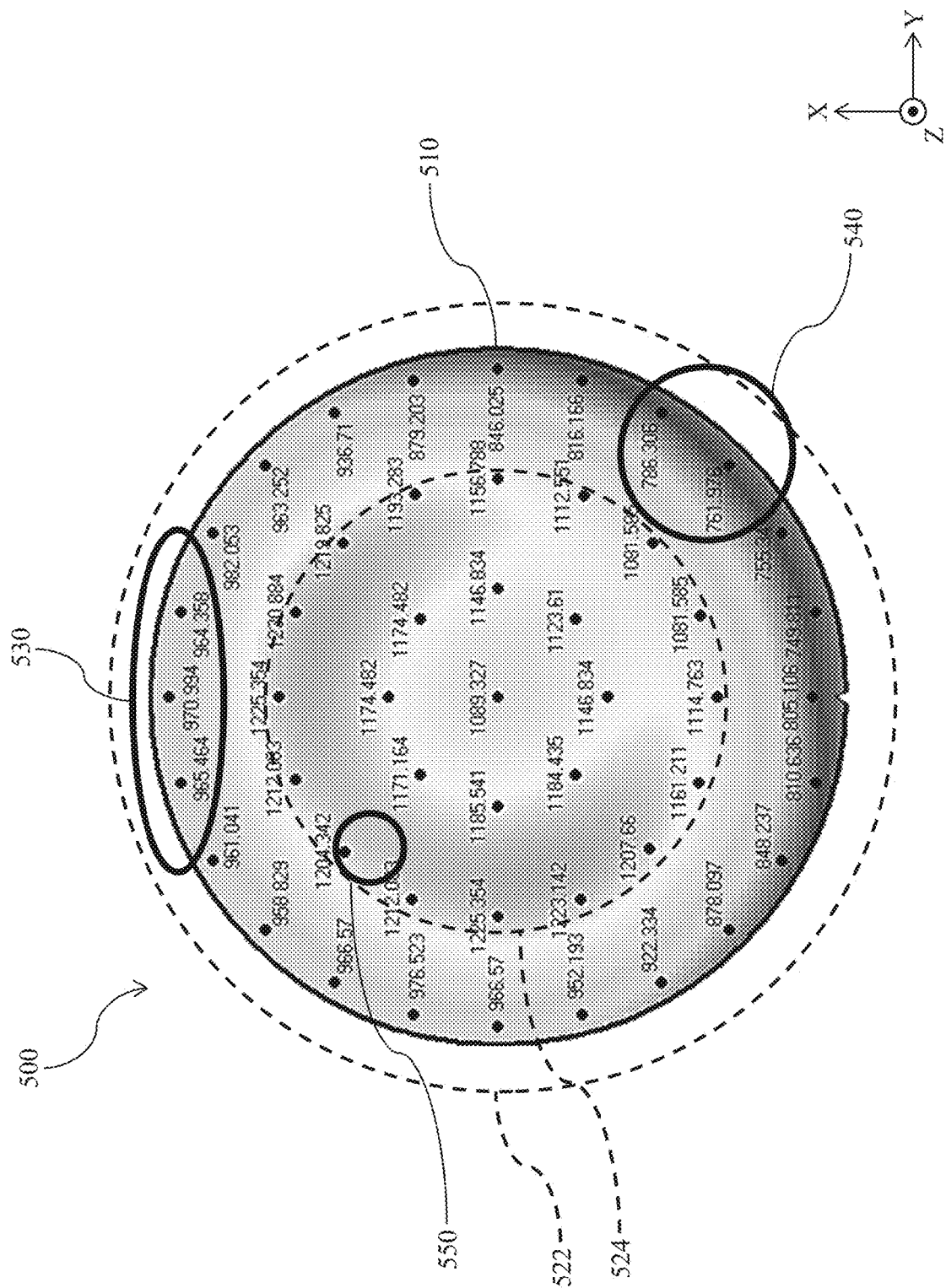
FIG. 5 illustrates an exemplary critical dimension (CD) map of a wafer, in accordance with some embodiments of the present disclosure.

FIG. 5 illustrates an exemplary critical dimension (CD) map 500 of a wafer 510, in accordance with some embodiments of the present disclosure. As shown in FIG. 5, the CD map 500 shows a distribution of CD performance, e.g. bulk chemical distribution (BCD), on the wafer 510. Based on a top view of the wafer 510, FIG. 5 shows a corresponding projection of the GDP placed above the wafer 510, where the GDP has an annular shape bordered by an outer circle 522 and an inner circle 524. In addition, FIG. 5 also shows wafer portions of the wafer 510 corresponding to the gas inlet, the gas outlet, and the RF inlet.

In this example, a wafer portion 540 corresponds to the gas inlet. That is, the wafer portion 540 is closer to the gas inlet than any other portion of the wafer 510, and is referred to as the gas inlet portion 540. In this example, the gas inlet portion 540 is located at the right lower corner, to a direction between Y and −X, of the wafer 510. As discussed before, due to a higher process gas density at the gas inlet portion 540, the gas inlet portion 540 tends to have a lower etching rate than other wafer portions. As such, with all holes on the GDP following a same designing profile, the BCD performance of a point on the wafer 510 tends to become lower as the point moves closer to the gas inlet portion 540.

In this example, a wafer portion 550 corresponds to the RF inlet. That is, the wafer portion 550 is closer to the RF inlet than any other portion of the wafer 510, and is referred to as the RF inlet portion 550. In this example, the RF inlet portion 550 is located at the left upper portion, to a direction between X and −Y, of the wafer 510. As discussed before, due to a stronger magnetic field and a higher plasma density at the wafer portion 550, the RF inlet portion 550 tends to have a higher etching rate than other wafer portions. As such, with all holes on the GDP following a same designing profile, the BCD performance of a point on the wafer 510 tends to become higher as the point moves closer to the RF inlet portion 550.

In this example, a wafer portion 530 corresponds to the gas outlet. That is, the wafer portion 530 is closer to the gas outlet than any other portion of the wafer 510, and is referred to as the gas outlet portion 530. In this example, the gas outlet portion 530 is located at the top portion, to the X direction, of the wafer 510. As such, process gas received from the gas inlet can reach the gas outlet portion 530 following either a shorter path along the right side of the gas inlet portion 540 or a longer path along the left side of the gas inlet portion 540. As shown in FIG. 5, with all holes on the GDP following a same designing profile, the etching rate tends to be lower at the right side of the wafer 510 compared to the etching rate at the left side of the wafer 510.

Figure 6:
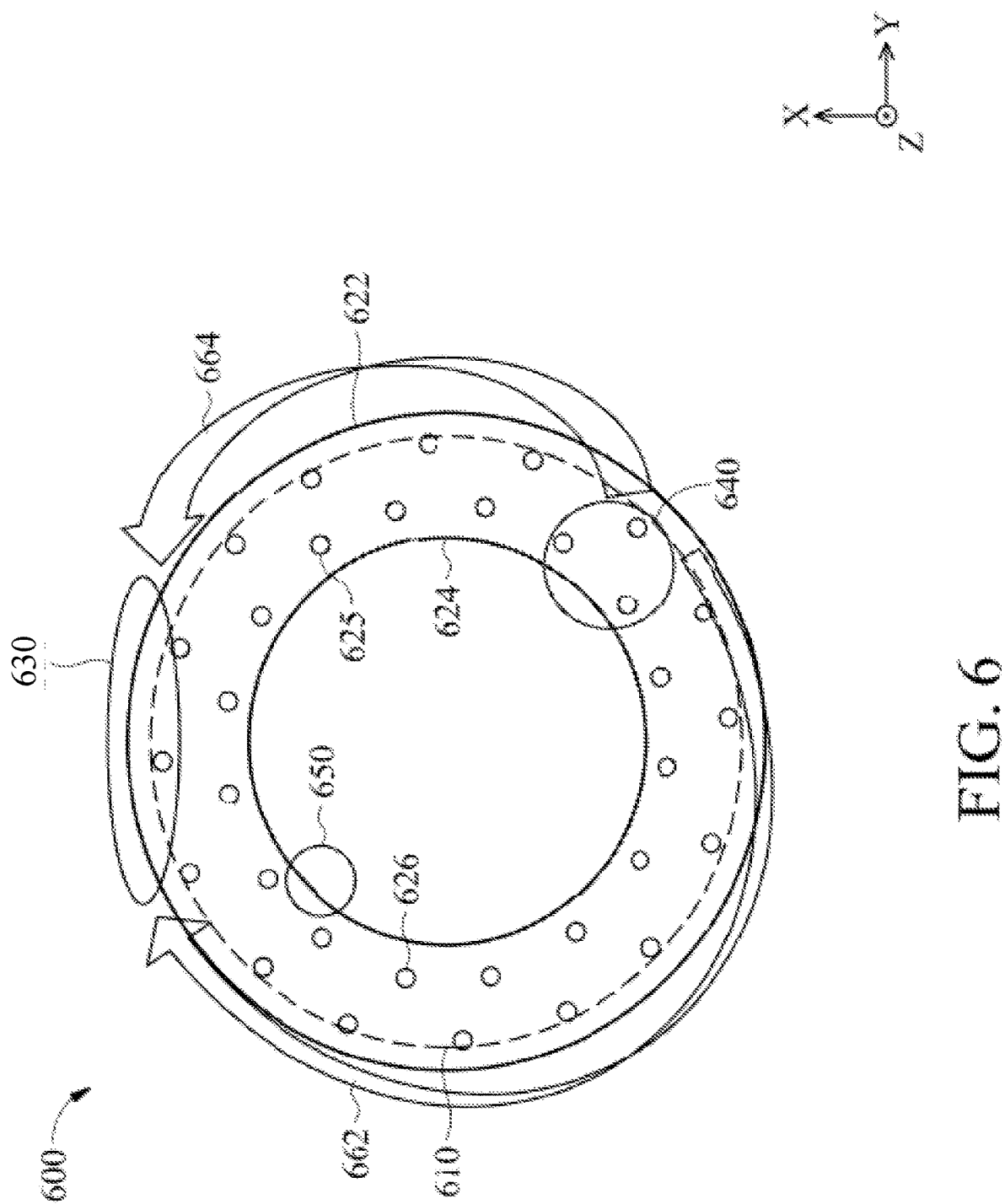
FIG. 6 illustrates a top view of an exemplary GDP with marked positions for a gas inlet, a gas outlet, and a radio frequency (RF) inlet, in accordance with some embodiments of the present disclosure.

FIG. 6 illustrates a top view of an exemplary GDP 600 with marked positions for a gas inlet, a gas outlet, and a radio frequency (RF) inlet, in accordance with some embodiments of the present disclosure. In one embodiment, the GDP 600 may be implemented as the GDP 240 in FIG. 2. As shown in FIG. 6, the GDP 600 in this example has an annular shape bordered by an outer circle 622 and an inner circle 624. The GDP 600 has a plurality of holes 625, 626 evenly distributed thereon. Based on the top view of the GDP 600, FIG. 6 shows a corresponding projection of the wafer 610 placed under the GDP 600.

In one embodiment, the wafer 610 and the GDP 600 are the same as or correspond to the wafer 510 and the GDP on the wafer 510, respectively. In addition, FIG. 6 also shows GDP portions of the GDP 600 corresponding to the gas inlet, the gas outlet, and the RF inlet.

In this example, a GDP portion 640 corresponds to the gas inlet. That is, the gas inlet portion 640 is closer to the gas inlet than any other portion of the GDP 600, and is referred to as the gas inlet portion 640. In this example, the gas inlet portion 640 is located at the right lower corner, to a direction between Y and −X, of the GDP 600. As discussed before, due to a higher process gas density under the gas inlet portion 640, a wafer portion under the gas inlet portion 640 tends to have a lower etching rate than other wafer portions.

In this example, a GDP portion 650 corresponds to the RF inlet. That is, the GDP portion 650 is closer to the RF inlet than any other portion of the GDP 600, and is referred to as the RF inlet portion 650. In this example, the RF inlet portion 650 is located at the left upper portion, to a direction between X and −Y, of the GDP 600. As discussed before, due to a stronger magnetic field and a higher plasma density under the GDP 600, a wafer portion under the RF inlet portion 650 tends to have a higher etching rate than other wafer portions.

In this example, a GDP portion 630 corresponds to the gas outlet. That is, the GDP portion 630 is closer to the gas outlet than any other portion of the GDP 600, and is referred to as the gas outlet portion 630. In this example, the gas outlet portion 630 is located at the top portion, to the X direction, of the GDP 600. As such, process gas received from the gas inlet can reach the gas outlet portion 630 following either a shorter path 664 along the right side of the gas inlet portion 640 or a longer path 662 along the left side of the gas inlet portion 640.

Figure 7A:
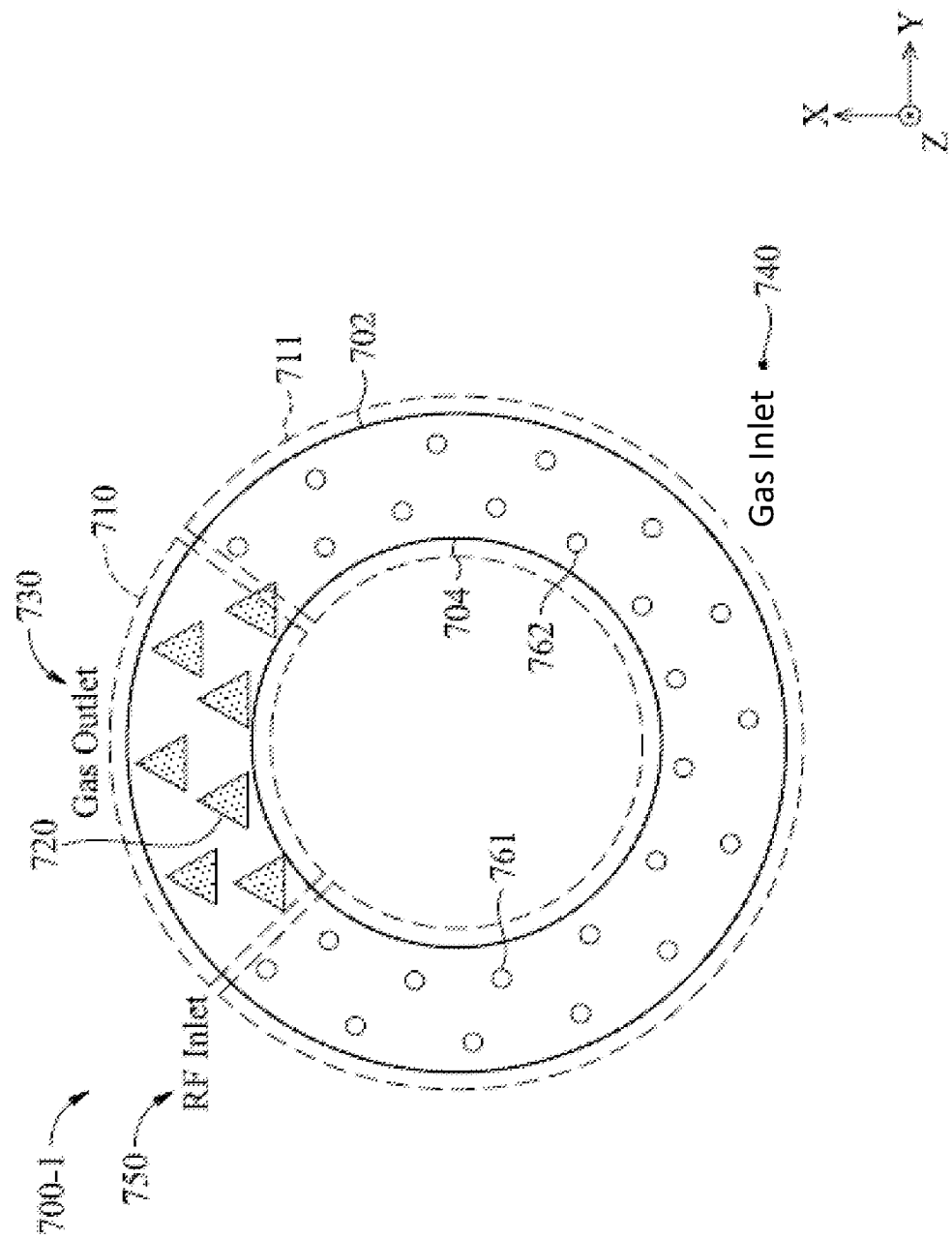
FIG. 7A illustrates a top view of an exemplary GDP divided into multiple zones, in accordance with some embodiments of the present disclosure.

FIG. 7A illustrates a top view of an exemplary GDP 700-1 divided into multiple zones, in accordance with some embodiments of the present disclosure. In one embodiment, the GDP 700-1 may be implemented as the GDP 240 in FIG. 2. As shown in FIG. 7A, the GDP 700-1 in this example has an annular shape bordered by an outer circle 702 and an inner circle 704. The GDP 700-1 has a plurality of holes 761, 762 evenly distributed thereon. Similar to FIG. 6, FIG. 7A shows GDP portions of the GDP 700-1 corresponding to the gas inlet, the gas outlet, and the RF inlet. In this example, a GDP portion 740 corresponding to the gas inlet is closer to the gas inlet than any other portion of the GDP 700-1, and is located at the right lower corner, to a direction between Y and −X, of the GDP 700-1, and is referred to as the gas inlet portion 740; a GDP portion 750 corresponding to the RF inlet is closer to the RF inlet than any other portion of the GDP 700-1 and is located at the left upper portion, to a direction between X and −Y, of the GDP 700-1, and is referred to as the RF inlet portion 750; and a GDP portion 730 corresponding to the gas outlet is closer to the gas outlet than any other portion of the GDP 700-1 and is located at the top portion, to the X direction, of the GDP 700-1, and is referred to as the gas outlet portion 730.

In this embodiment, the GDP 700-1 is divided into a plurality of zones: a first zone 710 and a second zone 711. The first zone 710 is closer to the gas outlet and the GDP portion 730 than the second zone 711. That is, a first average distance between each hole of the first zone 710 and the position of the gas outlet (or the GDP portion 730) is shorter than a second average distance between each hole of the second zone 711 and the position of the gas outlet (or the GDP portion 730). In addition, the first zone 710 is a portion on the GDP 700-1 that is closest to the gas outlet. At least one hole 720 in the first zone 710 may be closed to reduce the gas flow and etching rate at the gas outlet side of the wafer in the first zone 710 and increase the gas flow and etching rate at the opposite side of the gas outlet of the wafer in the second zone 711.

In this example, all holes 720 in the first zone 710 are closed; and all holes 761, 762 in the second zone 711 are open. This can compensate for the wafer non-uniformity induced by the layout and position of the gas outlet relative to the GDP 700-1. In one case, during the manufacturing of the GDP 700-1, there is no hole generated in the first zone 710. In another case, during the manufacturing of the GDP 700-1, all holes generated in the first zone 710 are closed or filled. In yet another case, all holes evenly distributed on the GDP 700-1 can be opened or closed based on a mechanism that can be controlled based on the zone division method disclosed herein and the layouts of the gas outlet portion 730, the gas inlet portion 740 and/or the RF inlet portion 750.

Figure 7B:
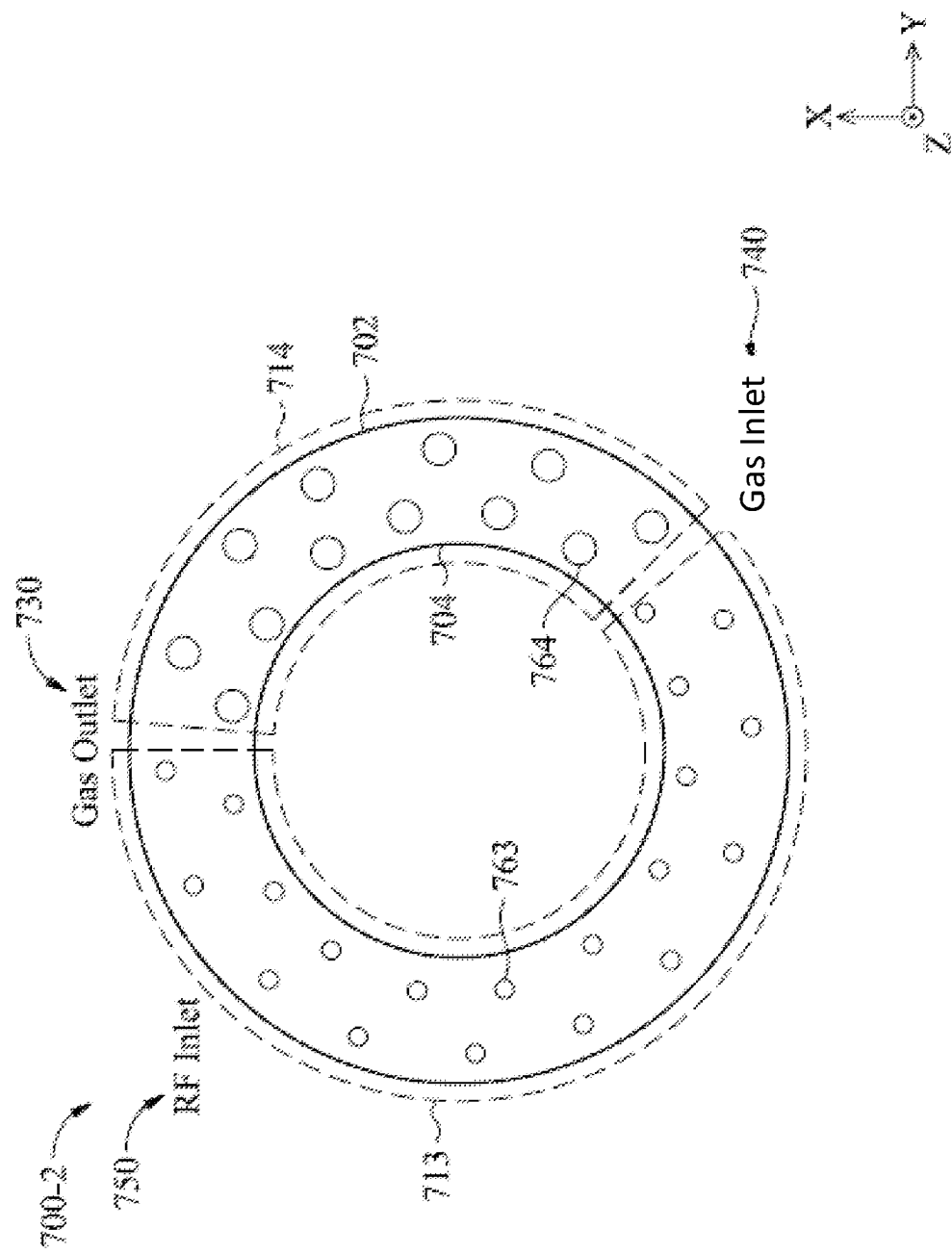
FIG. 7B illustrates a top view of another exemplary GDP divided into multiple zones, in accordance with some embodiments of the present disclosure.

FIG. 7B illustrates a top view of another exemplary GDP 700-2 divided into multiple zones, in accordance with some embodiments of the present disclosure. In one embodiment, the GDP 700-2 may be implemented as the GDP 240 in FIG. 2. As shown in FIG. 7B, the GDP 700-2 in this example has an annular shape bordered by an outer circle 702 and an inner circle 704. The GDP 700-2 has a plurality of holes 763, 764 evenly distributed thereon. FIG. 7B shows GDP portions of the GDP 700-2 corresponding to the gas inlet, the gas outlet, and the RF inlet, including: a GDP portion 740 corresponding to the gas inlet that is closer to the gas inlet than any other portion of the GDP 700-2, and is located at the right lower corner, to a direction between Y and −X, of the GDP 700-2; a GDP portion 750 corresponding to the RF inlet that is closer to the RF inlet than any other portion of the GDP 700-2 and is located at the left upper portion, to a direction between X and −Y, of the GDP 700-2; and a GDP portion 730 corresponding to the gas outlet that is closer to the gas outlet than any other portion of the GDP 700-2 and is located at the top portion, to the X direction, of the GDP 700-2.

In this embodiment, the GDP 700-2 is divided into a plurality of zones: a first zone 714 and a second zone 713. The first zone 714 is bordered between the gas inlet portion 740 and the gas outlet portion 730 along a shorter path on the GDP 700-2; while the second zone 713 is bordered between the gas inlet portion 740 and the gas outlet portion 730 along a longer path on the GDP 700-2. The first zone 714 is closer to the gas outlet and the GDP portion 730 than the second zone 713. That is, a first average distance between each hole of the first zone 714 and the position of the gas outlet (or the GDP portion 730) is shorter than a second average distance between each hole of the second zone 713 and the position of the gas outlet (or the GDP portion 730). In one embodiment, a total area of the holes in the first zone 714 is the same as that of the holes in the second zone 713.

In this example, holes 764 in the first zone 714 have an average area larger than that of holes 763 in the second zone 713. This can compensate for the wafer non-uniformity induced by the layouts and positions of both the gas inlet and the gas outlet relative to the GDP 700-2.

In one case, as shown in FIG. 7B, the first zone 714 comprises a first plurality of holes each of which has a first diameter; and the second zone 713 comprises a second plurality of holes each of which has a second diameter that is smaller than the first diameter. In one example, the first diameter is in a range from about 0.48 mm to about 0.52 mm, e.g. 0.5 mm; the second diameter is in a range from about 0.4 mm to about 0.46 mm, e.g. 0.44 mm. According to Bernoulli's principle, given a same fluid quantity or volume flow rate, the cross-sectional area is inversely proportional to the flowing velocity of the fluid. As such, given the same volume flow rate of the process gas received from the gas inlet, a smaller hole increases the flowing velocity of the process gas passing through the hole, while a larger hole decreases the flowing velocity of the process gas passing through the hole.

For example, the hole 763 is in the second zone 713 corresponding to a longer path from the gas inlet GDP portion 740 to the gas outlet GDP portion 730; and the hole 764 is in the first zone 714 corresponding to a shorter path from the gas inlet GDP portion 740 to the gas outlet GDP portion 730. As such, when the hole 763 and the hole 764 have a same size, the process gas passing through the hole 763 would have a lower flowing velocity than that of the process gas passing through the hole 764. With a design of different diameters, the hole 763 may have a smaller diameter, e.g. 0.44 mm, to increase the flowing velocity of its passing process gas; and the hole 764 may have a larger diameter, e.g. 0.5 mm, to decrease the flowing velocity of its passing process gas. This compensates for the flowing velocity non-uniformity induced by the layouts and positions of the gas inlet and the gas outlet; and hence compensates for the CD non-uniformity on the wafer after the plasma-based process.

Figure 7C:
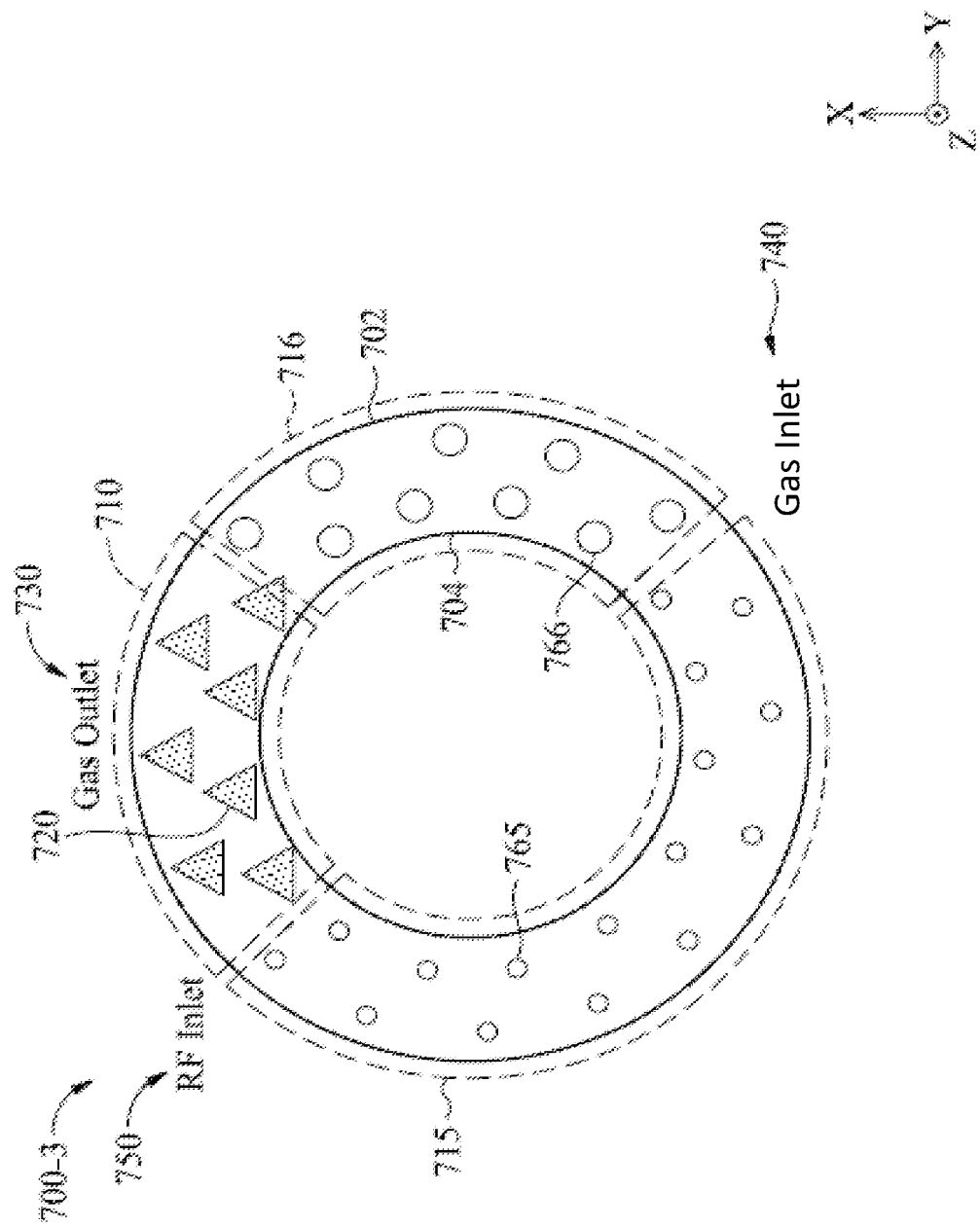
FIG. 7C illustrates a top view of yet another exemplary GDP divided into multiple zones, in accordance with some embodiments of the present disclosure.

FIG. 7C illustrates a top view of another exemplary GDP 700-3 divided into multiple zones, in accordance with some embodiments of the present disclosure. In one embodiment, the GDP 700-3 may be implemented as the GDP 240 in FIG. 2. As shown in FIG. 7C, the GDP 700-3 in this example has an annular shape bordered by an outer circle 702 and an inner circle 704. The GDP 700-3 has a plurality of holes 765, 766 evenly distributed thereon. FIG. 7C shows GDP portions of the GDP 700-3 corresponding to the gas inlet, the gas outlet, and the RF inlet, including: a GDP portion 740 corresponding to the gas inlet that is closer to the gas inlet than any other portion of the GDP 700-3, and is located at the right lower corner, to a direction between Y and −X, of the GDP 700-3; a GDP portion 750 corresponding to the RF inlet that is closer to the RF inlet than any other portion of the GDP 700-3 and is located at the left upper portion, to a direction between X and −Y, of the GDP 700-3; and a GDP portion 730 corresponding to the gas outlet that is closer to the gas outlet than any other portion of the GDP 700-3 and is located at the top portion, to the X direction, of the GDP 700-3.

In this embodiment, the GDP 700-3 is divided into a plurality of zones: a first zone 710, a second zone 715, and a third zone 716. The first zone 710 is closer to the gas outlet and the GDP portion 730 than the second zone 715 and the third zone 716. In addition, the first zone 710 may be a portion on the GDP 700-3 that is closest to the gas outlet. At least one hole 720 in the first zone 710 may be closed to reduce the gas flow and etching rate at the gas outlet side of the wafer in the first zone 710 and increase the gas flow and etching rate at other portions of the wafer corresponding to the second zone 715 and the third zone 716. In one example, all holes 720 in the first zone 710 are closed; and all holes 765 in the second zone 715 and all holes 766 in the third zone 716 are open. The second zone 715 and the third zone 716 may be treated as two sub-zones of a same zone with open holes. This can compensate for the wafer non-uniformity induced by the layout and position of the gas outlet relative to the GDP 700-3. In one case, during the manufacturing of the GDP 700-3, there is no hole generated in the first zone 710. In another case, during the manufacturing of the GDP 700-3, all holes generated in the first zone 710 are closed or filled. In yet another case, all holes evenly distributed on the GDP 700-3 can be opened or closed based on a mechanism that can be controlled based on the zone division method disclosed herein and the layouts of the gas outlet portion 730, the gas inlet portion 740 and/or the RF inlet portion 750.

The first zone 710 is bordered between two edges on two sides of the gas outlet portion 730 respectively, including a left edge on the left side and a right edge on the right side. The third zone 716 is bordered between the gas inlet portion 740 and the right edge of the first zone 710 along a shorter path from the gas inlet portion 740 to the first zone 710; while the second zone 715 is bordered between the gas inlet portion 740 and the left edge of the first zone 710 along a longer path from the gas inlet portion 740 to the first zone 710. The third zone 716 is closer to the gas outlet and the GDP portion 730 than the second zone 715. That is, a first average distance between each hole of the third zone 716 and the position of the gas outlet (or the GDP portion 730)

is shorter than a second average distance between each hole of the second zone 715 and the position of the gas outlet (or the GDP portion 730). In one embodiment, a total area of the holes in the third zone 716 is the same as that of the holes in the second zone 715.

In this example, holes 766 in the third zone 716 have an average area larger than that of holes 765 in the second zone 715. This can further compensate for the wafer non-uniformity induced by the layouts and positions of the gas inlet and the gas outlet relative to the GDP 700-3.

In one case, as shown in FIG. 7C, the third zone 716 comprises a first plurality of holes each of which has a first diameter; and the second zone 715 comprises a second plurality of holes each of which has a second diameter that is smaller than the first diameter. In one example, the first diameter is in a range from about 0.48 mm to about 0.52 mm, e.g. 0.5 mm; the second diameter is in a range from about 0.4 mm to about 0.46 mm, e.g. 0.44 mm. For example, the hole 765 is in the second zone 715 corresponding to a longer path from the gas inlet GDP portion 740 to the gas outlet GDP portion 730; and the hole 766 is in the third zone 716 corresponding to a shorter path from the gas inlet GDP portion 740 to the gas outlet GDP portion 730. As such, when the hole 765 and the hole 766 have a same size, the process gas passing through the hole 765 would have a lower flowing velocity than that of the process gas passing through the hole 766. With a design of different diameters, the hole 765 may have a smaller diameter, e.g. 0.44 min, to increase the flowing velocity of its passing process gas; and the hole 766 may have a larger diameter, e.g. 0.5 mm, to decrease the flowing velocity of its passing process gas. This further compensates for the flowing velocity non-uniformity induced by the layouts and positions of the gas inlet and the gas outlet; and hence compensates for the CD non-uniformity on the wafer after the plasma-based process.

Figure 8:
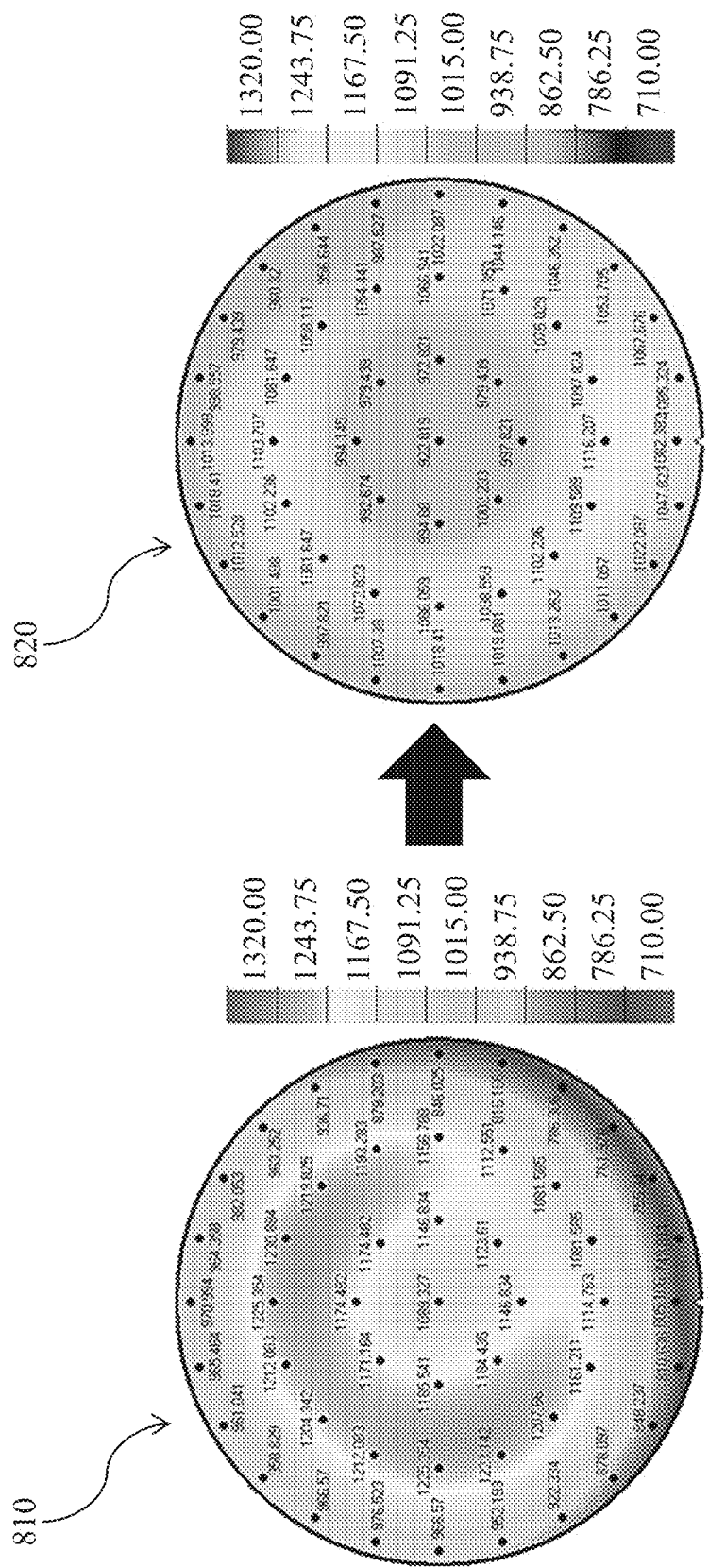
FIG. 8 illustrates exemplary CD maps of a wafer before and after using a disclosed GDP, in accordance with some embodiments of the present disclosure.

FIG. 8 illustrates exemplary CD maps of a wafer before and after using a disclosed GDP, e.g. the GDP disclosed in any of FIGS. 1-7, in accordance with some embodiments of the present disclosure. As shown in FIG. 8, the CD performance of a wafer processed using a disclosed GDP can achieve a higher uniformity than that of a wafer processed without using the disclosed GDP. In one example, a TSV BCD distribution on the wafer before using the disclosed GDP has a mean of about 1034, a 3-sigma value of about 465, and a uniformity of 23.3% which does not meet the uniformity requirement of 10%; while a TSV BCD distribution on the wafer after using the disclosed GDP has a same mean of about 1034, a smaller 3-sigma value of about 143, and a lower uniformity of 9.3% which meets the uniformity requirement of 10%.

Figure 9:
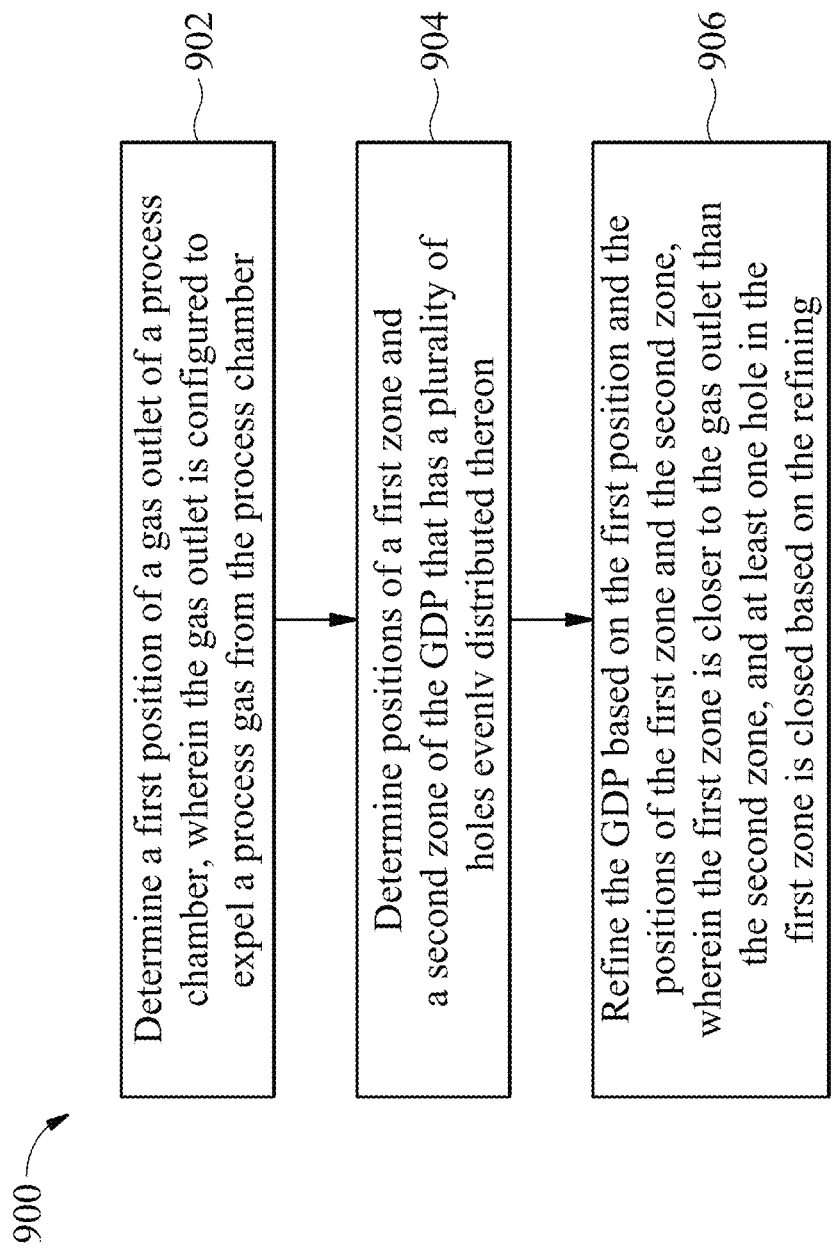
FIG. 9 is a flow chart illustrating an exemplary method for controlling wafer uniformity in plasma-based process, in accordance with some embodiments of the present disclosure.

FIG. 9 is a flow chart illustrating an exemplary method 900 for controlling wafer uniformity in plasma-based process, in accordance with some embodiments of the present disclosure. At operation 902, a first position of a gas outlet of a process chamber is determined. The gas outlet is configured to expel the processed gas from the process chamber. At operation 904, positions of a first zone and a second zone of the GDP are determined. The GDP has a plurality of holes evenly distributed thereon. At operation 906, the GDP is refined based on the first position and the positions of the first zone and the second zone. The GDP is to be arranged in the process chamber and configured to distribute the process gas within the process chamber. The first zone is closer to the gas outlet than the second zone. At least one hole in the first zone is closed based on the refining.

The order of the operations shown in FIG. 9 may be changed according to different embodiments of the present disclosure.

In an embodiment, a device for plasma-based processes is disclosed. The device includes: a housing defining a process chamber and a gas distribution plate (GDP) arranged in the process chamber. The housing comprises: a gas inlet configured to receive a process gas, and a gas outlet configured to expel processed gas. The GDP is configured to distribute the process gas within the process chamber. The GDP has a plurality of holes evenly distributed thereon. The GDP comprises a first zone and a second zone. The first zone is closer to the gas outlet than the second zone. At least one hole in the first zone is closed.

In another embodiment, a device for plasma-based processes is disclosed. The device includes: a housing defining a process chamber and a gas distribution plate (GDP) arranged in the process chamber. The housing comprises: a gas inlet configured to receive a process gas, and a gas outlet configured to expel processed gas. The GDP is configured to distribute the process gas within the process chamber. The GDP has a plurality of holes evenly distributed thereon. The GDP comprises a first zone and a second zone that are located on different sides of the gas inlet. The first zone is closer to the gas outlet than the second zone. Holes in the first zone have an average area larger than that of holes in the second zone.

In yet another embodiment, a method for designing a gas distribution plate (GDP) is disclosed. The method includes: determining a first position of a gas outlet of a process chamber, wherein the gas outlet is configured to expel processed gas from the process chamber; determining positions of a first zone and a second zone of the GDP that has a plurality of holes evenly distributed thereon; refining the GDP based on the first position and the positions of the first zone and the second zone. The GDP is to be arranged in the process chamber and configured to distribute the process gas within the process chamber. The first zone is closer to the gas outlet than the second zone. At least one hole in the first zone is closed based on the refining.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for plasma-based processes, comprising:
   a housing defining a process chamber, wherein the housing comprises:
      a gas inlet configured to receive a process gas, and
      a gas outlet configured to expel a processed gas; and
   a gas distribution plate (GDP) arranged in the process chamber and configured to distribute the process gas within the process chamber to achieve a silicon etching uniformity less than a threshold, the GDP comprising:
      an annular body that extends laterally from an inner sidewall to an outer sidewall and consists of a first zone, a second zone and a third zone positioned within the annular body, wherein the first, second and third zones form the entirety of the annular body, wherein the third zone is bordered between the gas inlet and a first edge of the first zone, and the second zone is bordered between the gas inlet and a second edge of the first zone opposite the first edge of the first zone such that the first zone is disposed between the second and third zones, and wherein the first zone comprises seven holes that are filled such that no gas flows through the first zone, and wherein the first zone comprises approximately one-quarter of the annular body;

a first plurality of holes extending through the third zone of the annular body from lower surface of the annular body toward an upper surface of the annular body; and a second plurality of holes extending through the second zone of the annular body from a lower surface of the annular body toward an upper surface of the annular body, wherein each of the first plurality of holes have a circular cross-section with a first diameter and each of the second plurality of holes have a circular cross-section with a second diameter, and a minimum value of the first diameter of each of the first plurality of holes is greater than a maximum value of the second diameter of each of the second plurality of holes, and wherein the first plurality of holes is smaller in number than that of the second plurality of holes.

2. The device of claim 1, wherein an average cross-sectional area of the first plurality of holes is greater than an average cross-sectional area of the second plurality of holes.

3. The device of claim 1, wherein the first zone is closer to the gas outlet than the second and third zones.

4. The device of claim 1, wherein:
the second zone and the third zone are located on different sides of the gas inlet.

5. The device of claim 1, wherein a total area of the first plurality of holes is the same as that of the second plurality of holes.

6. The device of claim 1, wherein the first zone has no open holes.

7. The device of claim 1, wherein:
the first diameter is in a range from about 0.48 mm to about 0.52 mm; and
the second diameter is in a range from about 0.4 mm to about 0.46 mm.

8. The device of claim 1, wherein:
the second zone and the third zone are located on different sides of the gas inlet;
the third zone comprises a first plurality of holes having a first average cross-sectional area;
the second zone comprises a second plurality of holes having a second average cross-sectional area that is less than the first cross-sectional average area.

9. A device for plasma-based processes, comprising:
a housing defining a process chamber, wherein the housing comprises:
a gas inlet configured to receive a process gas, and
a gas outlet configured to expel a processed gas; and
a gas distribution plate (GDP) arranged in the process chamber and configured to distribute the process gas within the process chamber to achieve a silicon etching uniformity less than 10%, the GDP comprising:
an annular body that extends laterally from an inner sidewall to an outer sidewall and consists of a first zone, a second zone and a third zone positioned within the annular body, wherein the first, second and third zones form the entirety of the annular body, wherein the third zone is bordered between the gas inlet and a first edge of the first zone, and the second zone is bordered between the gas inlet and a second edge of the first zone opposite the first edge of the first zone such that the first zone is disposed between the second and third zones, and wherein the first zone comprises seven holes that are filled such that no gas flows through the first zone, and wherein the first zone comprises approximately one-quarter of the annular body;

a first plurality of holes extending through the third zone of the annular body from lower surface of the annular body toward an upper surface of the annular body, wherein each of the first plurality of holes have a circular cross section with a first diameter; and a second plurality of holes extending through the second zone of the annular body from a lower surface of the annular body toward an upper surface of the annular body, wherein each of the second plurality of holes have a circular cross section with a second diameter, wherein the first diameter of each of the first plurality of holes is in the range of 0.48 to 0.52 millimeters (mm) and the second diameter of each of the second plurality of holes is in the range of 0.4 to 0.46 mm, and wherein the first plurality of holes is smaller in number than that of the second plurality of holes.

10. The device of claim 9, wherein the second zone and the third zone are located on different sides of the gas inlet.

11. The device of claim 10, wherein the first zone has no open holes.

12. The device of claim 10, wherein a total cross-sectional area of the first plurality of holes in the third zone is the same as a total cross-sectional area of the second plurality of holes in the second zone.

13. The device of claim 10, wherein:
the first average distance of between the first plurality of holes and the position of the gas outlet is shorter than a second average distance between the second plurality of holes and the position of the gas outlet.

14. A device for plasma-based processes, comprising:
a housing defining a process chamber, wherein the housing comprises:
a gas inlet configured to receive a process gas, and
a gas outlet configured to expel a processed gas; and
a gas distribution plate (GDP) arranged in the process chamber and configured to distribute the process gas within the process chamber to achieve a silicon etching uniformity less than a threshold, the GDP comprising:
an annular body that extends laterally from an inner sidewall to an outer sidewall and consists of a first zone, a second zone and a third zone positioned within the annular body, wherein the first, second and third zones form the entirety of the annular body, wherein the third zone is bordered between the gas inlet and a first edge of the first zone, and the second zone is bordered between the gas inlet and a second edge of the first zone opposite the first edge of the first zone such that the first zone is disposed between the second and third zones, and wherein the first zone comprises a plurality of holes that are filled such that no gas flows through the first zone, and wherein the first zone comprises approximately one-quarter of the annular body;

a first plurality of holes extending through the third zone of the annular body from lower surface of the annular body toward an upper surface of the annular body, wherein each of the first plurality of holes have a circular cross section with a first diameter; and a second plurality of holes extending through the second zone of the annular body from a lower surface of the annular body toward an upper surface of the annular body, wherein each of the second plurality of holes have a circular cross section with a second diameter, and wherein a minimum value of the first diameter of each of the first plurality of holes is greater than a maximum value of the second diameter of each of the second plurality of holes.

15. The device of claim 14, wherein a total cross-sectional area of the first plurality of holes in the third zone is the same as a total cross-sectional area of the second plurality of holes in the second zone.

16. The device of claim 14, wherein the first zone is closer to the gas outlet than the second and third zones.

17. The device of claim 14, wherein the second zone and the third zone are located on different sides of the gas inlet.

18. The device of claim 14, wherein the first diameter is in a range from about 0.48 mm to about 0.52 mm, and the second diameter is in a range from about 0.4 mm to about 0.46 mm.

* * * * *